(12) United States Patent
Foster et al.

(10) Patent No.: US 8,327,303 B1
(45) Date of Patent: Dec. 4, 2012

(54) TEMPLATE-BASED REAL NUMBER BEHAVIORAL MODELING

(75) Inventors: Paul C. Foster, Scotts Valley, CA (US); Walter E. Hartong, Isen (DE); T. Martin O'Leary, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 192 days.

(21) Appl. No.: 12/692,497

(22) Filed: Jan. 22, 2010

(51) Int. Cl.
*G06F 17/50* (2006.01)

(52) U.S. Cl. ...................................................... 716/106

(58) Field of Classification Search ............... 716/106
See application file for complete search history.

(56) References Cited

U.S. PATENT DOCUMENTS

| | | | |
|---|---|---|---|
| 6,714,021 B2 * | 3/2004 | Williams | 324/533 |
| 2007/0244686 A1 * | 10/2007 | Chang et al. | 703/19 |

* cited by examiner

*Primary Examiner* — Jack Chiang
*Assistant Examiner* — Brandon Bowers
(74) *Attorney, Agent, or Firm* — Kilpatrick Townsend & Stockton LLP

(57) ABSTRACT

A method and system for template-based behavioral model creation for behavioral modeling is disclosed. A design characterization and modeling (DCM) tool has a number of templates for different circuits. A designer chooses a template and customizes the template with a number of parameters and optionally pin assignments. The DCM tool generates a behavioral model that has real wire ("Wreal") capability. The transistor level design is simulated with a testbench according to the parameters to generate Wreal calibration information. The behavioral model uses the Wreal calibration information in behavioral modeling to provide quick behavioral processing of the behavioral model with the benefit of increased accuracy provided by the Wreal calibration information, for example. Optionally, the DCM tool generates another testbench that validates the analog and behavioral models.

19 Claims, 8 Drawing Sheets

TEMPLATE-BASED REAL NUMBER BEHAVIORAL MODELING

BACKGROUND

This disclosure relates in general to electronic design automation (EDA) tool systems and, but not by way of limitation, to real number behavioral modeling.

Simulation of a circuit design with a digital EDA tool lacks the precision of analog simulation of the circuit design. Analog simulation is time intensive and impractical in many situations. Circuit design typically involves working with both digital and analog simulation in different realms having different tools and verification. There is little coordination between these tools and flaws are often not uncovered until the latter stages of the design process causing costly and time consuming rework.

To avoid problems in an application specific integrated circuit (ASIC), design verification and testing is a critical part of mixed signal designs. To assure good success, full functional verification is often performed at the transistor level. This type of verification is slow on large designs and not practical. During the design process, different blocks may or may not have a transistor level equivalent making full functional verification difficult to do until near the end of the process.

SUMMARY

In one embodiment, the present disclosure provides template-based behavioral model creation to behaviorally model a design. A design characterization and modeling (DCM) tool has a number of templates to different circuits. A designer chooses a template and customizes the template with a number of parameters and possibly pin assignments. The DCM tool generates a behavioral model that has real wire ("Wreal") capability along with possibly other generated models. The transistor level design is simulated with a testbench according to the parameters to generate Wreal calibration information. The behavioral model uses the Wreal calibration information to provide quick behavioral processing of the behavioral model with the benefit of increased accuracy provided by the Wreal calibration information, for example. Optionally, the DCM tool validates that the behavioral models matches the transistor level design using the testbench.

In another embodiment, the present disclosure provides an electronic design automation (EDA) tool system to process behavioral models of an transistor level design, the EDA tool system comprising a model generation function, an analog EDA tool and a behavioral EDA tool. The model generation function is configured to: receive selection of a template from a plurality of templates, wherein the template corresponds to the transistor level design, receive a plurality of parameters, and generate a first model wherein the first model is configured to take into account analog behavior of the transistor level design. The analog EDA tool configured to generate real number calibration information according to the plurality of parameters. The real number calibration information is indicative of analog operation of the transistor level design. The behavioral EDA tool is configured to: automatically receive the real number calibration information, and simulate the transistor level design as a function of the real number calibration information.

In yet another embodiment, the present disclosure provides a computer-implemented method to process a transistor level design using templates. Selection of a template from a plurality of templates is received along with a plurality of parameters. A first model is generated that is configured to take into account analog behavior of the transistor level design. Real number calibration information is generated according to the plurality of parameters, where the real number calibration information is indicative of analog operation of the transistor level design. The transistor level design is simulated as a function of the real number calibration information in a behavioral modeling tool.

In still another embodiment, the present disclosure provides a computer-readable medium with software to execute on a computing system, the computer-readable medium comprising code for: receiving selection of a template from a plurality of templates; receiving a plurality of parameters; generating a first model, wherein the first model is configured to take into account analog behavior of the transistor level design; generating real number calibration information according to the plurality of parameters, wherein the real number calibration information is indicative of analog operation of the transistor level design; and simulating the transistor level design as a function of the real number calibration information in a behavioral modeling tool.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description to implement a preferred exemplary embodiment. It is understood that various changes may be made in the function and arrangement of elements without departing from the spirit and scope as set forth in the appended claims.

Figure 1:
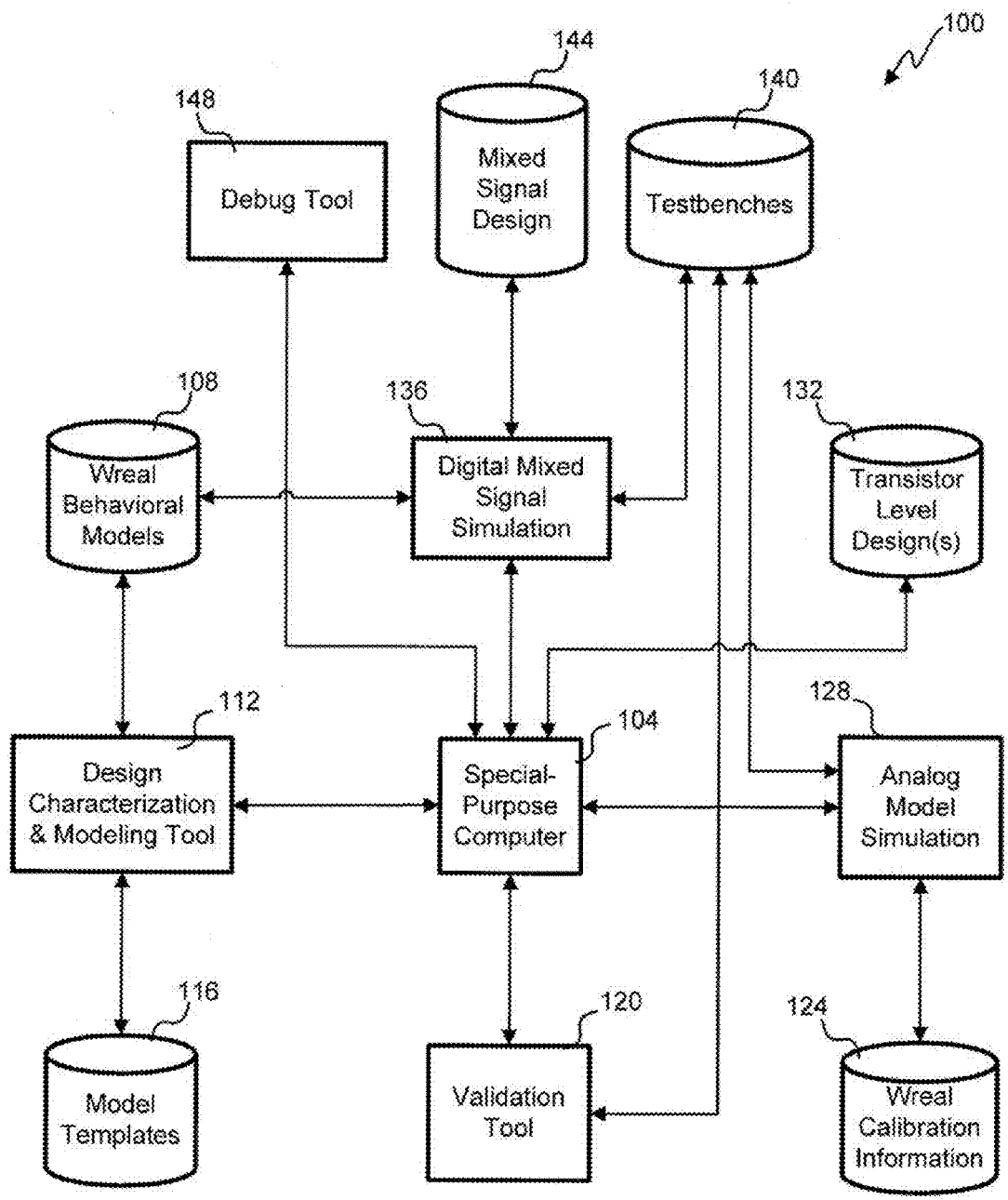
FIG. 1 depicts a block diagram of an embodiment of a electronic design automation (EDA) tool system.

Referring first to FIG. 1, a block diagram of an embodiment of a electronic design automation (EDA) tool system 100 is shown. This is merely an exemplary EDA tool system 100 and other embodiments could have more or less tools in creating a circuit or system of circuits. The various tools are shown being run on a special purpose computer 104, but different tools could be instead run on any number of special purpose computers 104 in any number of different locations. Indeed, large circuits involve many teams of designers often in different locations working together. Updates to a circuit design by one designer might be reconciled with another designer performing debug on a nightly, weekly or according to some other frequency.

A design characterization & modeling (DCM) tool 112 has a store of model templates 116 to a number of different circuits that commonly appear in circuit designs. A designer chooses from the number of model templates 116 to pick one that corresponds to an existing analog or mixed signal circuit or to one the designer wants to create. Pin signals are mapped to the existing analog or mixed signal circuit or otherwise renamed using the DCM tool 112. Additionally, parameters such as power supply voltage, loading on outputs, temperature ranges, process details, etc. can all be input to the DCM tool.

The DCM tool 112 automatically creates both a real wire ("Wreal") behavioral model 108 and possibly other generated models according to the template configuration information entered by the designer that matches the transistor level design at some level of abstraction. For example, some embodiments could create models using VHDL real signals and SystemVerilog real signals. Additionally, a testbench 140 is automatically generated from the template by the DCM tool 112. The generated testbench 140 is used to simulate the transistor level design to extract its responses to stimulus. The testbench 140 can generate Wreal calibration information 124 from the transistor level design 132. These measured results from the transistor level design simulation are used to create lookup tables that correlate input conditions to the transistor level design with output responses. These lookup tables are used within the behavioral model and indexed according to the input conditions. The resultant value found from the lookup table is used to define/control how the behavioral model performs. In this way, the DCM tool 112 automatically generates Wreal calibration information 124 and stores it to use by other tools in the EDA tool system 100.

As used herein, Wreal is a capability that allows analog values and performance to be simulated within an event driven digital simulator rather than a matrix based analog simulator.

In one embodiment, this results in significant performance improvements to the simulation of behavioral models. The behavioral model is calibrated to the transistor level design behavior so that the behavioral model closely replicates the behavior of the original transistor level design.

The store holding the Wreal calibration information 124 to each transistor level design 132 is a database that holds a number of different values to signal pins on the behavioral model as the parameters and inputs change. The Wreal calibration information 124 are real numbers that allow approximation of analog behavior. Extractions from the Wreal calibration information 124 can take the form of a look-up table or fitted curve. The Wreal behavioral models 108 have access to the Wreal calibration information to provide mixed signal analysis of the Wreal behavioral models 108. The Wreal calibration information can be event driven to digital simulation.

Wreal or real number information is passed to the digital mixed simulation (DMS) tool 136 with the Wreal behavioral model 108 to allow design simulation taking into account analog behavior of the circuitry without simulating to the transistor level in this embodiment. Transistor level simulation is hundreds of times slower than behavioral or digital simulation. The Wreal behavioral models 108 are referenced in a mixed signal design 144 that represents the circuit being designed. A wreal behavior model 108 allows 'analog like' operation in a digital simulation environment DMS tool 136 uses Wreal calibration information 124 from the analog model simulation 128 to have a more accurate behavioral model during simulation. Waveform, measured results, validation and debug tools are all Wreal aware to integrate that information into processing of the mixed signal design 144. All tools have access to the Wreal behavioral models 108 and Wreal calibration information 124 to process the mixed signal design 144.

Figure 2:
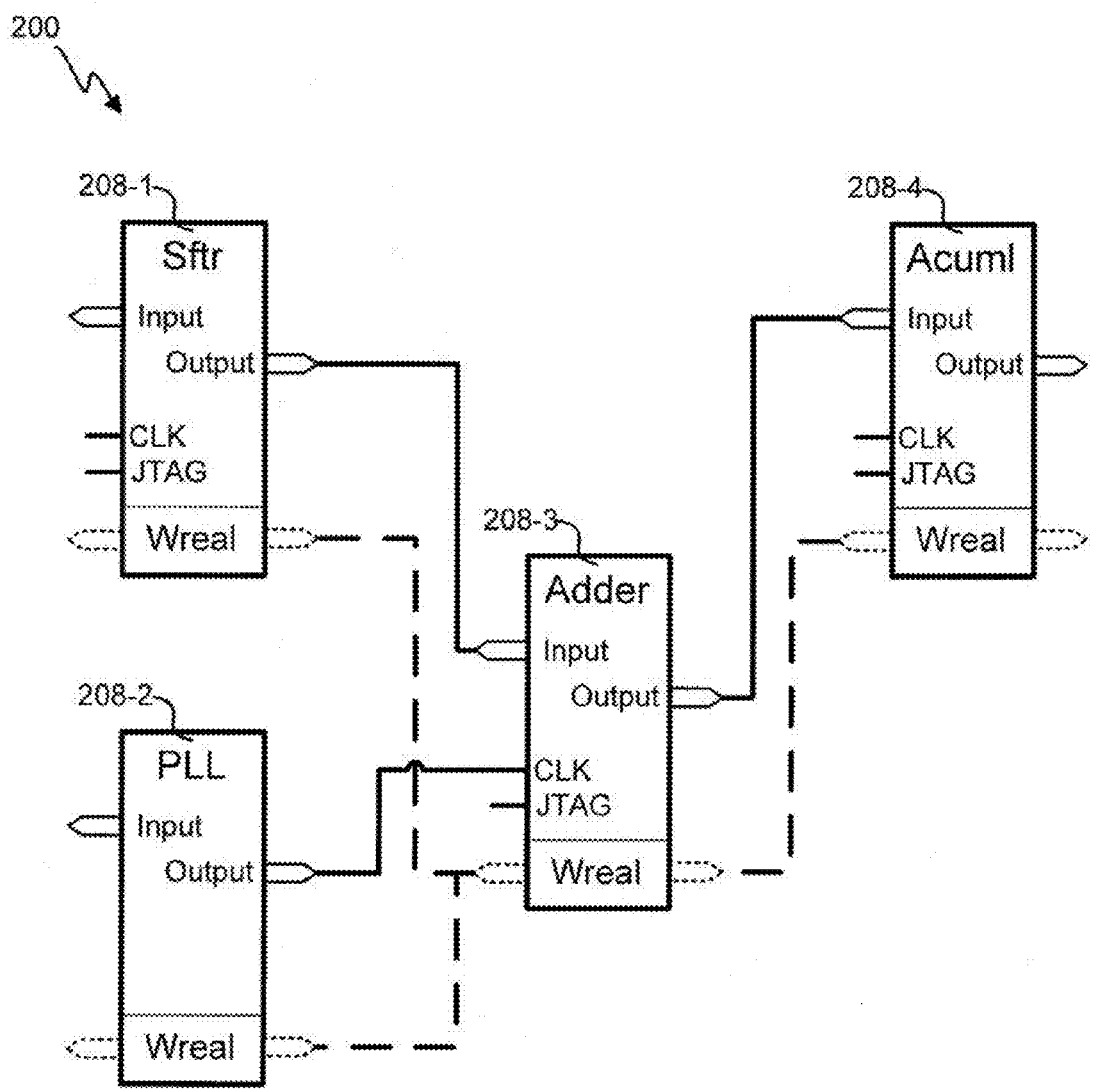
FIG. 2 depicts a schematic diagram of an embodiment of an electronic circuit with mixed signal blocks.

With reference to FIG. 2, a schematic diagram of an embodiment of an electronic circuit 200 with mixed signal cells is shown. The various cells 208 are analog and/or digital to test with DMS simulation 136 and are a small part of the circuit. Each cell 208 has various inputs and outputs along with an interface to Wreal calibration information 124, which is shown in the schematic diagram to illustrate a point. The ports to lookup tables holding the Wreal calibration information 124 would not normally be shown in a schematic diagram. In the background, the various cells 208 would access lookup tables and pass results shown with dashed lines although not normally shown in a schematic diagram. The DMS simulation 136 can be performed in an event driven manner. Between events, the cell transformation function from inputs to outputs will be controlled by using the Wreal calibration information 124 to estimate analog performance.

A value from the lookup table is processed within the cell model to define a new value of a cell output that is passed to the next cell. The below Table shows an example of a look-up table to a voltage controlled oscillator (VCO) cell. To each voltage, a different frequency is output. Values between data points can be interpolated as necessary. Beyond this simple example, a typical set of Wreal calibration information 124 will have many more dimensions varying the frequency based upon supply voltage, loading of output, temperature, etc.

TABLE

| VCO Lookup Table | |
| --- | --- |
| Control Voltage | Output Frequency |
| 0.0 V | 1.0 MHz |
| 0.5 V | 2.1 MHz |
| 1.0 V | 3.3 MHz |
| 1.5 V | 4.7 MHz |
| 2.0 V | 6.4 MHz |
| 2.5 V | 8.5 MHz |
| 3.0 V | 9.0 MHz |
| 3.5 V | 9.4 MHz |

Figure 3:
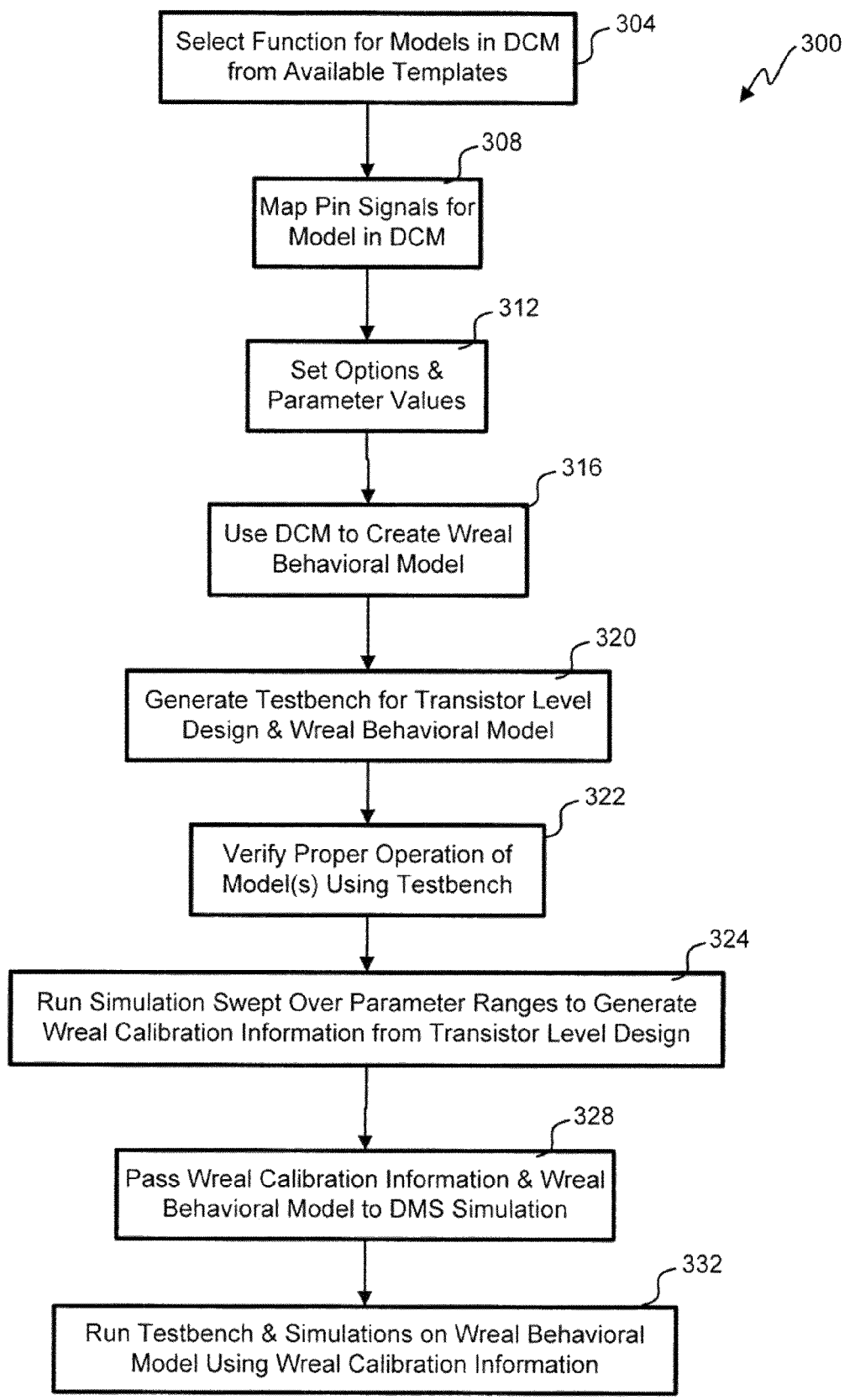
FIG. 3 illustrates a flowchart of an embodiment of a process to perform template-based model creation and verification.

With reference to FIG. 3, a flowchart of an embodiment of a process 300 is used to show template-based model creation and verification. The depicted portion of the process begins in block 304 where the designer chooses a template corresponding to the circuit they are working on. For example, the circuit may be a voltage controlled oscillator (VCO) and the designer would choose the template to the VCO. In block 308, the pin signals of their existing transistor level design are mapped to the template. Naming of the pin signals can be changed if desired. The template has options to accommodate different versions of the template design, fabrication details and other parameters. Different design variants of VCOs are supported by the template. The template is configurable to different numbers of pins, pin types and/or behavior/accuracy.

At this point in the process 300 the DCM tool 112 is configured by the designer. The DCM tool 112 creates a Wreal behavioral model 108 and possibly other generated models in block 316. Two models would be created in some embodiments, for example, there could be models to a variety of different languages Verilog or VHDL or there could be purely analog, Verilog-AMS, Verilog-A, Wreal or totally digital representations. These models are functionally equivalent at some level, but are at different amounts of abstraction from the circuit. The Wreal behavioral model is a behavioral abstraction of the behavior of the transistor level design. The Wreal behavioral model is calibrated to approximate analog behavior of the original transistor level design. The different abstraction of models replicate the behavior of the transistor level design by using lookup tables created from measurements of the behavior of the original transistor level design.

A testbench is optionally generated that can verify that the transistor level design 132 and the Wreal behavioral model 108 operate in the same way. Another embodiment could have two testbenches, one to test that the transistor level design 132 matches the Wreal behavioral model and another testbench to generate Wreal calibration to the Wreal behavioral model 108. The testbench that verifies operation of the Wreal behavioral model 108 will work on the transistor level design 132, but simulation at the transistor level will take far more time to perform. The verification using the validation tool 120 can be automatically performed or manually activated in block 322.

The DCM tool 112 generates a testbench that will produce the Wreal calibration information from the transistor level design 132. In block 324, the transistor level design 132 is simulated over parameter ranges using this testbench and analog performance is recorded in a database 124 as Wreal calibration information. The Wreal behavioral model has procedure calls to retrieve the Wreal calibration information in the form of a lookup table and to approximate analog operation of the transistor level design under simulation. The Wreal calibration information 124 and Wreal behavioral model are made available to the DMS simulation tool 136 and any other tools in the EDA tool system 100. In block 332, testbenches, simulation, verification and/or debug is run against the Wreal behavioral model using the Wreal calibration information 124 typically as part of a larger circuit simulation with many different behavioral or digital models. As the transistor level design changes and evolves during the circuit design process, the testbench and behavioral model(s) can be recreated by the DCM tool 112 and rerun to formulate new Wreal calibration information that is propagated out to the EDA tool system 110.

Figure 4A:
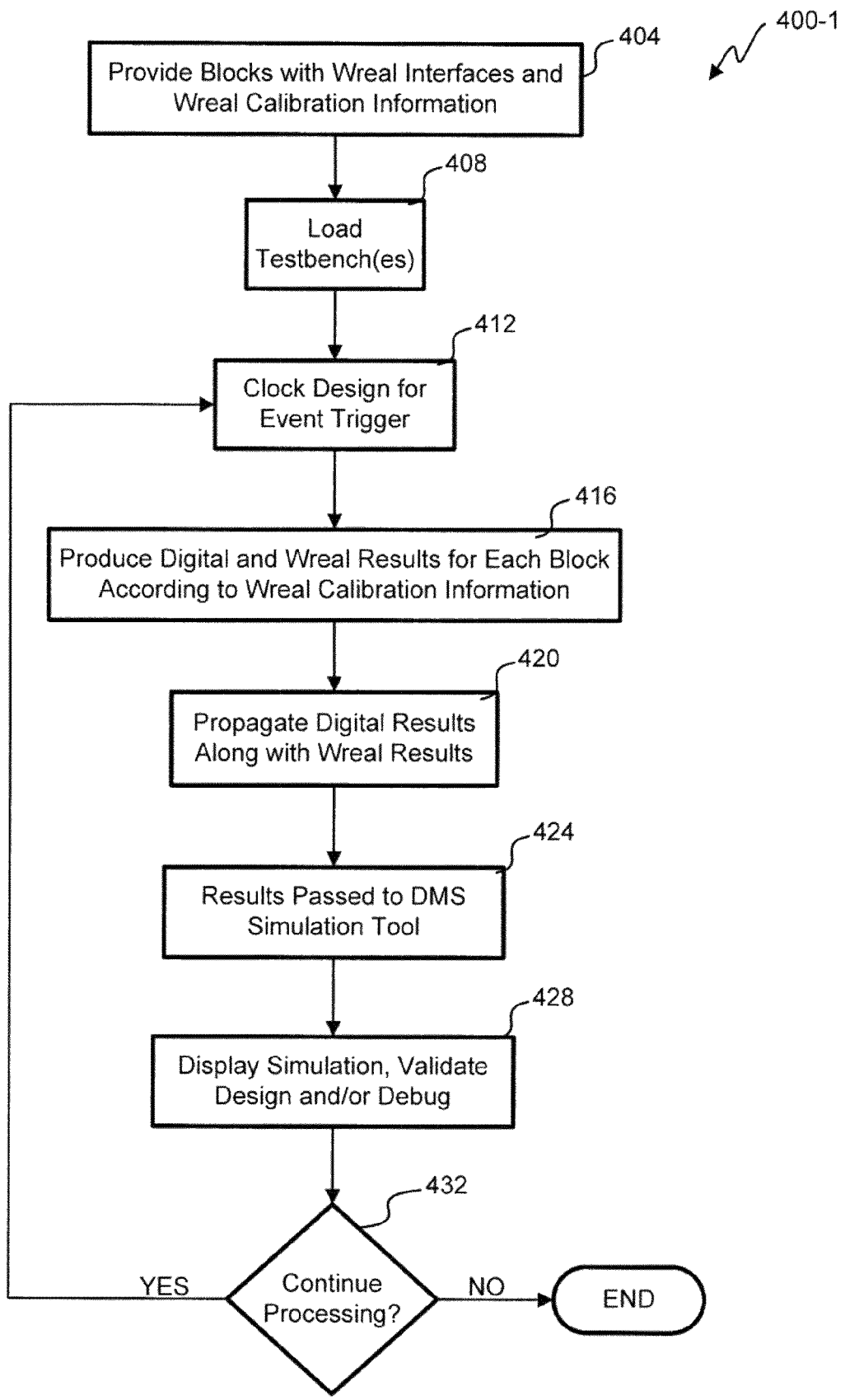
FIGS. 4A and 4B illustrate flowcharts of embodiments of a process of behavioral EDA processing with real number calibration.

Referring next to FIG. 4A, a flowchart of an embodiment of a process 400-1 to behavioral EDA processing with real number calibration is shown. The depicted portion of the process begins in block 404 where there are a number of nodes, blocks, cells or behavioral models provided with at least some having Wreal calibration information. In block 408, one or more testbenches are loaded. The testbenches could be to a cell, a group of cells or the entire circuit design. The remaining blocks are run in a loop that performs one pass per clock cycle in this embodiment. The Wreal behavioral models are iterated to Wreal signal changes also and not just logic/clock changes. In a mixed-signal environment, there may be portions of the circuit design that perform additional processing between clock cycles. For example, the design could be totally analog with only wreal behavioral models and not include and digital/logic signals at all. The DMS tool 136 would still simulate the totally analog design and not depend on clock cycles of the simulation. Additionally, some designs could have multi-phased clocks or multiple independent clocks.

In block 412, the circuit design is clocked which creates an event trigger. Wreal signal changes could also cause an event trigger. Digital and Wreal results are determined to each cell of circuitry in block 416 and propagated to the next cell in block 420. Signal paths through a cell may be digital or wreal with or without wreal calibration information. Where the signal path is a wreal signal, a check is made for wreal calibration information. If the wreal calibration information exists, it is used, but the wreal calibration information is optional. A given cell may have outputs to a number of cells. Each of that number of cells would receive the Wreal results that could be interpreted with their own Wreal calibration information to determine how to react in the next pass through the loop. In some cases, there may not be calibration information to certain signals passing through a cell and would only propagate digital logic changes.

In block 424, the results are passed to any other tools in the EDA tool system 100 such as the DMS simulation tool 136. The results are displayed in the DMS simulation tool 136 and possibly a validation tool 120 and/or debug tool 148 in block 428. If continued simulation or processing is desired as determined in block 432, another pass through the loop takes place by looping back to block 412. If processing is done, the process 400 ends and any results are optionally stored.

Figure 4B:
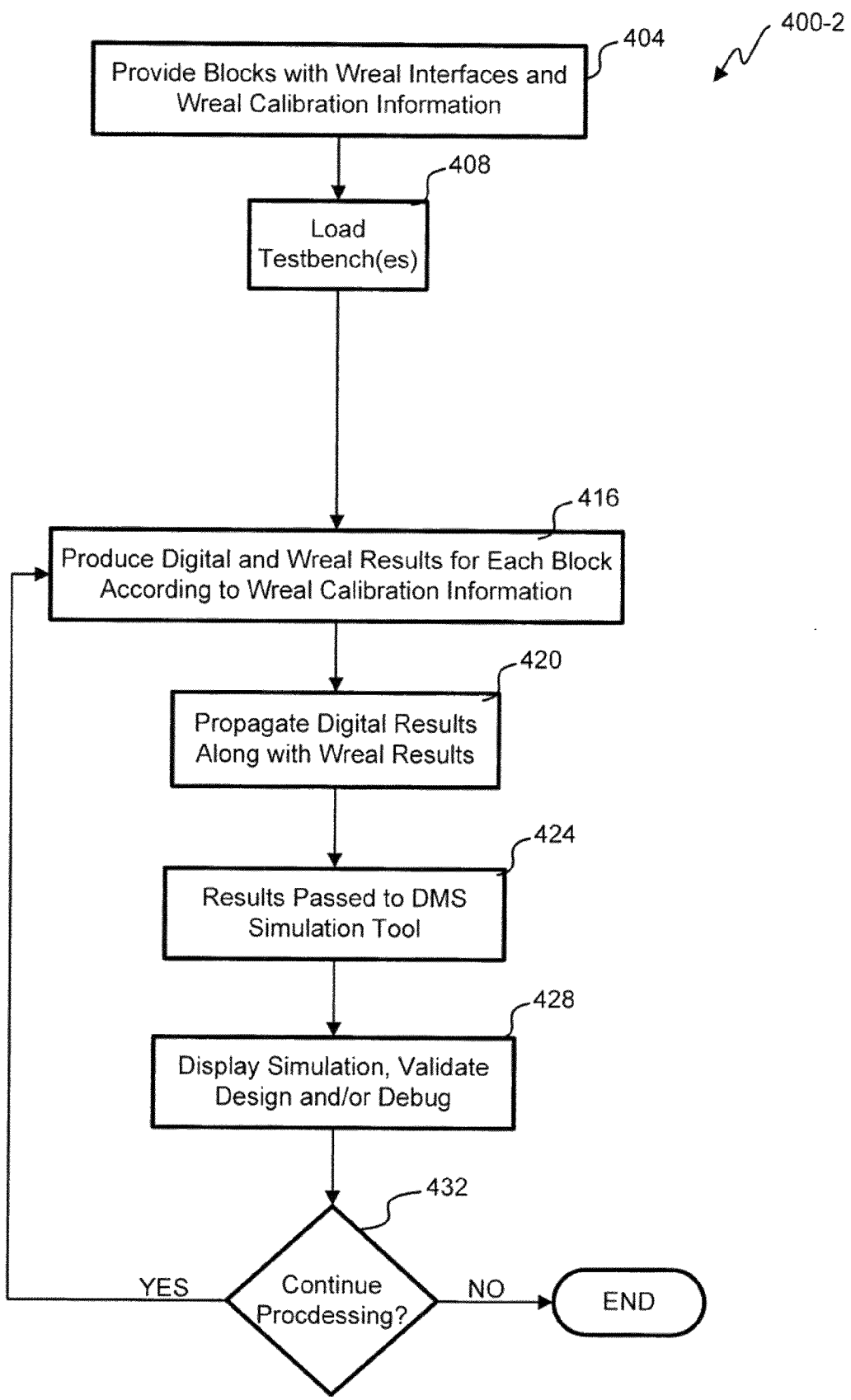

With reference to FIG. 4B, a flowchart of another embodiment of a process 400-2 is used to show behavioral EDA processing with real number calibration. This embodiment is not event driven like the embodiment of FIG. 4A, specifically block 412 is removed. Each behavioral model with Wreal capability can continuously update in this embodiment. There can also be digital cells that update less frequently.

Figure 5:
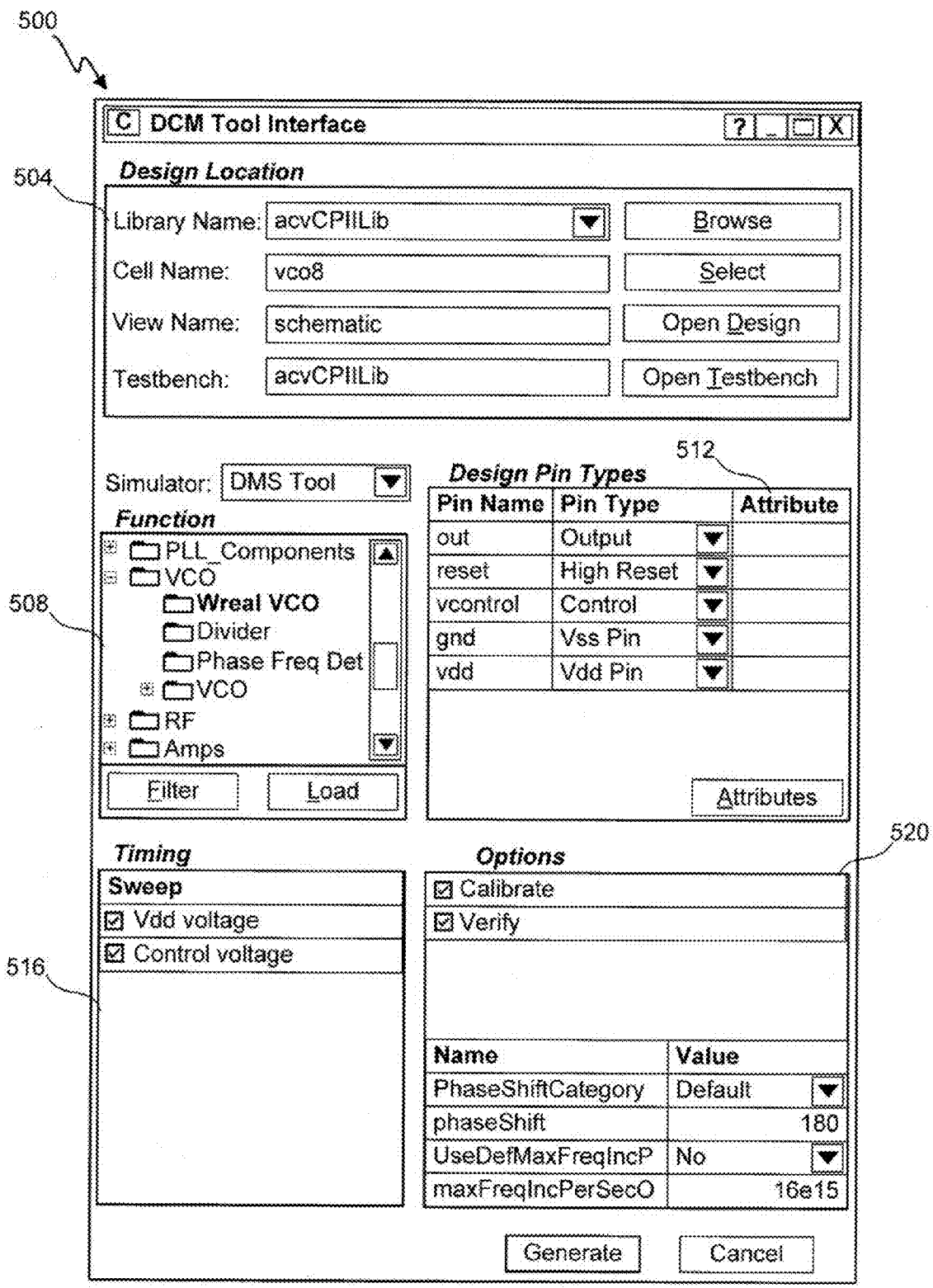
FIG. 5 depicts a screen shot of an embodiment of a design characterization & modeling (DCM) tool interface.

Referring next to FIG. 5, a screen shot of an embodiment of a DCM tool interface 500 is shown. In a design location portion 504 of the interface 500, the cell library, cell name, testbench and other configuration can be selected. The design location portion allows designating the transistor level design 132 to use and its constituent cells along with a testbench name. The transistor level design in this embodiment was previously created.

A function portion 508 of the interface 500 presents a hierarchical interface to select different templates. The template maps the transistor level design to a template that is used to generate a Wreal behavioral model and testbench. The simulation tool can also be chosen. For the particular template, the pins are mapped to the transistor level design in another portion 512 of the interface.

The interface also allows defining parameters to manipulate the testbench. In a timing portion 516, the swept parameters that are varied can individually be selected. In an options portion 520, the designer can choose if the testbench generates Wreal calibration information in addition to verifying operation of the transistor level design. Phase shift and the granularity of the testbench stimulation can also be chosen. Other embodiments could have additional configuration and some embodiments could allow script or command line interface to the DCM tool 112.

Figure 6:
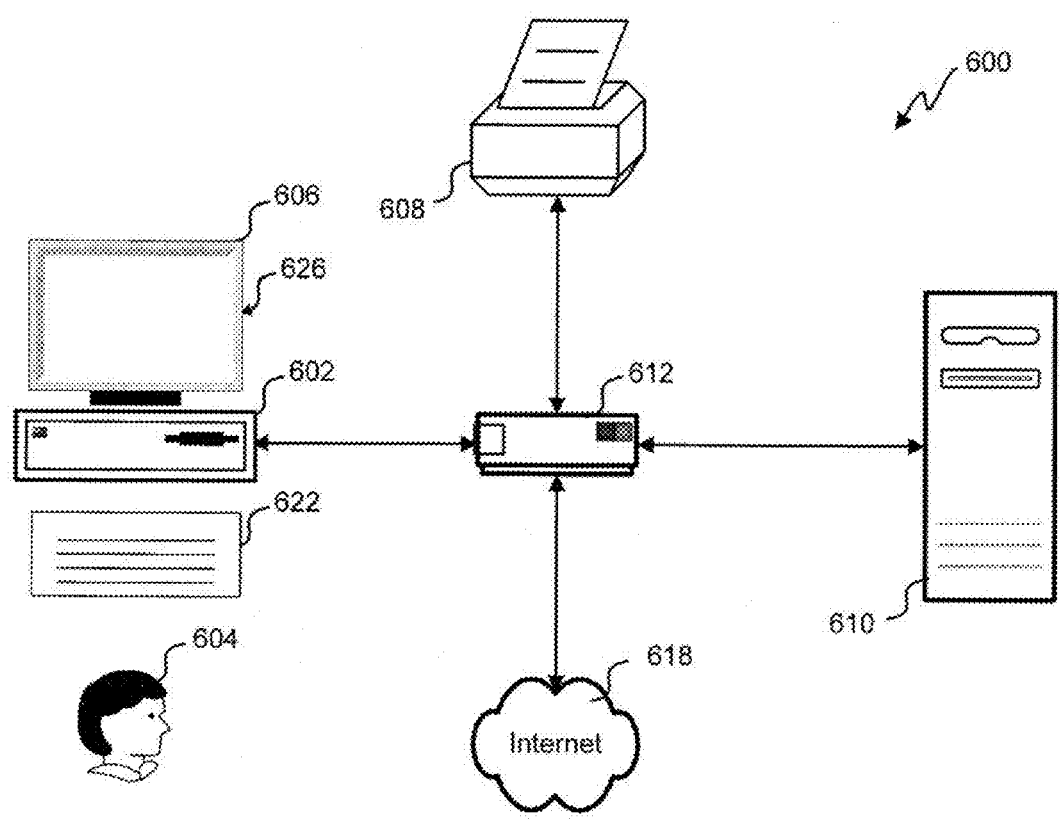
FIG. 6 depicts a block diagram of an embodiment of a EDA system.

Referring next to FIG. 6, an exemplary environment with which embodiments of the invention may be implemented is shown with a EDA system 600 that can be used by a designer 604 to design, for example, electronic circuits. The EDA system 600 can include a computer 602, keyboard 622, a network router 612, a printer 608, and a monitor 606. The monitor 606, processor 602 and keyboard 622 are part of a computer system 626, which can be a laptop computer, desktop computer, handheld computer, mainframe computer, etc. The monitor 606 can be a CRT, flat screen, etc.

A circuit designer 604 can input commands into the computer 602 using various input devices, such as a mouse, keyboard 622, track ball, touch screen, etc. If the EDA system 600 comprises a mainframe, a designer 604 can access the computer 602 using, for example, a terminal or terminal interface. Additionally, the computer system 626 may be connected to a printer 608 and a server 610 using a network router 612, which may connect to the Internet 618 or a WAN.

The server 610 may, for example, be used to store additional software programs and data. In one embodiment, software implementing the systems and methods described herein can be stored on a storage medium in the server 610. Thus, the software can be run from the storage medium in the server 610. In another embodiment, software implementing the systems and methods described herein can be stored on a storage medium in the computer 602. Thus, the software can be run from the storage medium in the computer system 626. Therefore, in this embodiment, the software can be used whether or not computer 602 is connected to network router 612. Printer 608 may be connected directly to computer 602, in which case, the computer system 626 can print whether or not it is connected to network router 612.

Figure 7:
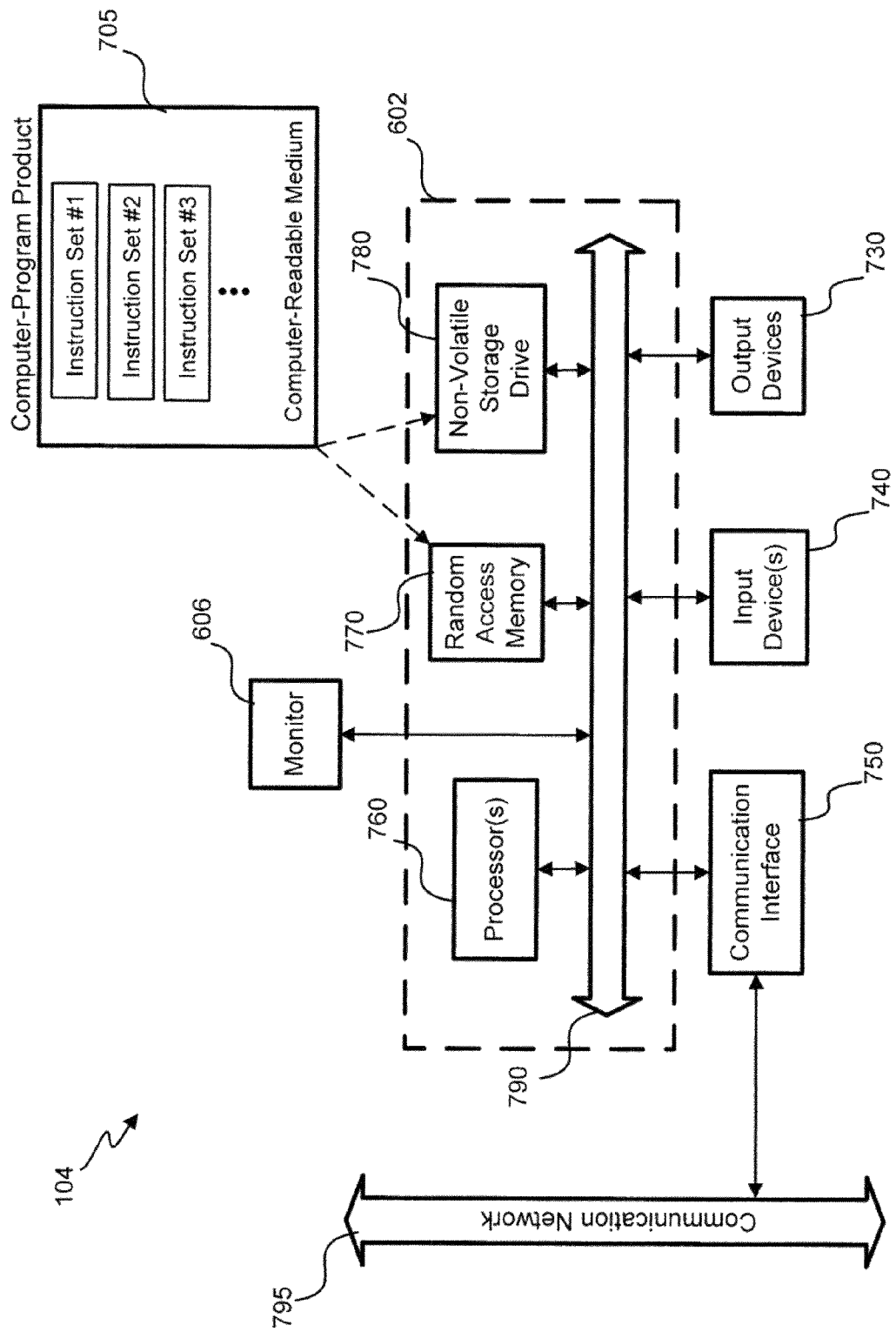
FIG. 7 depicts a block diagram of an embodiment of a special-purpose computer system.

With reference to FIG. 7, an embodiment of a special-purpose computer system 104 is shown. The above methods may be implemented by computer-program products that direct a computer system to perform the actions of the above-described methods and components. Each such computer-program product may comprise sets of instructions (codes) embodied on a computer-readable medium that directs the processor of a computer system to perform corresponding actions. The instructions may be configured to run in sequential order, or in parallel (such as under different processing threads), or in a combination thereof. After loading the computer-program products on a general purpose computer system 626, it is transformed into the special-purpose computer system 104 to perform EDA.

Special-purpose computer system 104 comprises a computer 602, a monitor 606 coupled to computer 602, one or more additional user output devices 730 (optional) coupled to computer 602, one or more user input devices 740 (e.g., keyboard, mouse, track ball, touch screen) coupled to computer 602, an optional communications interface 750 coupled to computer 602, a computer-program product 705 stored in a tangible computer-readable memory in computer 602. Computer-program product 705 directs system 104 to perform the above-described methods. Computer 602 may include one or more processors 760 that communicate with a number of peripheral devices via a bus subsystem 790. These peripheral devices may include user output device(s) 730, user input device(s) 740, communications interface 750, and a storage subsystem, such as random access memory (RAM) 770 and non-volatile storage drive 780 (e.g., disk drive, optical drive, solid state drive), which are forms of tangible computer-readable memory.

Computer-program product 705 may be stored in non-volatile storage drive 780 or another computer-readable medium accessible to computer 602 and loaded into memory 770. Each processor 760 may comprise a microprocessor, such as a microprocessor from Intel® or Advanced Micro Devices, Inc.®, or the like. To support computer-program product 705, the computer 602 runs an operating system that handles the communications of product 705 with the above-noted components, as well as the communications between the above-noted components in support of the computer-program product 705. Exemplary operating systems include Windows® or the like from Microsoft Corporation, Solaris® from Sun Microsystems, LINUX, UNIX, and the like.

User input devices 740 include all possible types of devices and mechanisms to input information to computer system 602. These may include a keyboard, a keypad, a mouse, a scanner, a digital drawing pad, a touch screen incorporated into the display, audio input devices such as voice recognition systems, microphones, and other types of input devices. In various embodiments, user input devices 740 are typically embodied as a computer mouse, a trackball, a track pad, a joystick, wireless remote, a drawing tablet, a voice command system. User input devices 740 typically allow a user to select objects, icons, text and the like that appear on the monitor 606 via a command such as a click of a button or the like. User output devices 730 include all possible types of devices and mechanisms to output information from computer 602. These may include a display (e.g., monitor 606), printers, non-visual displays such as audio output devices, etc.

Communications interface 750 provides an interface to other communication networks and devices and may serve as an interface to receive data from and transmit data to other systems, WANs and/or the Internet 618. Embodiments of communications interface 750 typically include an Ethernet card, a modem (telephone, satellite, cable, ISDN), a (asynchronous) digital subscriber line (DSL) unit, a FireWire® interface, a USB® interface, a wireless network adapter, and the like. For example, communications interface 750 may be coupled to a computer network, to a FireWire® bus, or the like. In other embodiments, communications interface 750 may be physically integrated on the motherboard of computer 602, and/or may be a software program, or the like.

RAM 770 and non-volatile storage drive 780 are examples of tangible computer-readable media configured to store data such as computer-program product embodiments of the present invention, including executable computer code, human-readable code, or the like. Other types of tangible computer-readable media include floppy disks, removable hard disks, optical storage media such as CD-ROMs, DVDs, bar codes, semiconductor memories such as flash memories, read-only-memories (ROMs), battery-backed volatile memories, networked storage devices, and the like. RAM 770 and non-volatile storage drive 780 may be configured to store the basic programming and data constructs that provide the functionality of various embodiments of the present invention, as described above.

Software instruction sets that provide the functionality of the present invention may be stored in RAM 770 and non-volatile storage drive 780. These instruction sets or code may be executed by the processor(s) 760. RAM 770 and non-volatile storage drive 780 may also provide a repository to store data and data structures used in accordance with the present invention. RAM 770 and non-volatile storage drive 780 may include a number of memories including a main random access memory (RAM) to store of instructions and data during program execution and a read-only memory (ROM) in which fixed instructions are stored. RAM 770 and non-volatile storage drive 780 may include a file storage subsystem providing persistent (non-volatile) storage of program and/or data files. RAM 770 and non-volatile storage drive 780 may also include removable storage systems, such as removable flash memory.

Bus subsystem 790 provides a mechanism to allow the various components and subsystems of computer 602 communicate with each other as intended. Although bus subsystem 790 is shown schematically as a single bus, alternative embodiments of the bus subsystem may utilize multiple busses or communication paths within the computer 602.

A number of variations and modifications of the disclosed embodiments can also be used. For example, an existing transistor level design could be entered into the DCM tool and encapsulated, verified and characterized. Wreal calibration information on the existing transistor level design would be passed along with the created behavioral model used in simulation. Indeed, during the evolution of a design, there may be many new transistor level versions of a transistor level design and the DCM tool could be used to validate and insert it into the behavioral simulation with updated Wreal calibration information.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

While the principles of the disclosure have been described above in connection with specific apparatuses and methods, it is to be clearly understood that this description is made only by way of example and not as limitation on the scope of the disclosure.

What is claimed is:

1. A system to process behavioral models of a transistor level design, the system comprising:
   a model generation function configured with a plurality of templates to a plurality of circuits, the plurality of templates including a template that corresponds to a circuit of the plurality of circuits, wherein the model generation function is configured to:
      receive selection of a template from the plurality of templates, wherein the template corresponds to the transistor level design,
      receive a plurality of parameters, and
      generate a first model according to the template customized with the plurality of parameters, wherein the first model is configured to take into account analog behavior of the transistor level design;
   an analog EDA tool configured to generate real number calibration information according to the plurality of parameters, wherein the real number calibration information is indicative of analog operation of the transistor level design; and
   a behavioral EDA tool configured to:
      automatically receive the real number calibration information, and
      simulate the transistor level design as a function of the real number calibration information.

2. The system to process behavioral models of the transistor level design as recited in claim 1, wherein the real number calibration information is event driven and relates analog performance of the transistor level design.

3. The system to process behavioral models of the transistor level design as recited in claim 1, wherein the model generation function is further configured to generate a second model, wherein the first and second model are functionally equivalent at some level of abstraction from the transistor level design.

4. The system to process behavioral models of the transistor level design as recited in claim 3, wherein:
   the second model is one of a plurality of models processed by the behavioral EDA tool, and
   the plurality of models pass a plurality of real number calibration information between themselves during processing of the plurality of models.

5. The system to process behavioral models of the transistor level design as recited in claim 1, wherein the real number calibration information is real number representations of analog behavior of the transistor level design.

6. The system to process behavioral models of the transistor level design as recited in claim 1, wherein the model generation function configured to generate three models that are equivalent at some level of abstraction.

7. The system to process behavioral models of the transistor level design as recited in claim 1, wherein the real number calibration information is contained in a look-up table where there are a range of values over a swept parameter.

8. The system to process behavioral models of the transistor level design as recited in claim 1, wherein the model generation function is configured to automatically generate a testbench, which is used by the analog EDA tool to generate the real number calibration information.

9. A computer-implemented method to process a transistor level design using templates, the method comprising:
   receiving, using a computer, selection of a template from a plurality of templates, the plurality of templates includes a template that corresponds to a circuit of a plurality of circuits;
   receiving, using the computer, a plurality of parameters;
   generating, using the computer, a first model according to the template customized with the plurality of parameters, wherein the first model is configured to take into account analog behavior of the transistor level design;
   generating, using the computer, real number calibration information according to the plurality of parameters, wherein the real number calibration information is indicative of analog operation of the transistor level design; and
   simulating, using the computer, the transistor level design as a function of the real number calibration information in a behavioral modeling tool.

10. The method as recited in claim 9, further comprising receiving pin signal mapping to the transistor level design within the first model.

11. The method as recited in claim 9, further comprising generating a second model, wherein the first and second model are functionally equivalent at some level of abstraction from the transistor level design.

12. The method as recited in claim 9, further comprising:
generating a testbench; and
verifying proper operation of the first model using the testbench.

13. The method as recited in claim 9, wherein the real number calibration information is contained in a look-up table where there are a range of values over a swept parameter.

14. The method as recited in claim 9, wherein the real number calibration information is event driven and relate analog performance.

15. The method as recited in claim 9, wherein the real number calibration information is real number representations of analog behavior.

16. A computer-readable non-transitory medium with software to execute on a computing system, the computer-readable medium comprising code for:
receiving selection of a template from a plurality of templates, the plurality of templates includes a template that corresponds to a circuit of a plurality of circuits;
receiving a plurality of parameters;
generating a first model according to the template customized with the plurality of parameters, wherein the first model is configured to take into account analog behavior of the transistor level design;
generating real number calibration information according to the plurality of parameters, wherein the real number calibration information is indicative of analog operation of the transistor level design; and
simulating the transistor level design as a function of the real number calibration information in a behavioral modeling tool.

17. The computer-readable non-transitory medium with software to execute on the computing system as recited in claim 16, further comprising code for receiving pin signal mapping for the transistor level design within the first model.

18. The computer-readable non-transitory medium with software to execute on the computing system as recited in claim 16, further comprising code for generating a second model, wherein the first and second model are functionally equivalent at some level of abstraction from the transistor level design.

19. The computer-readable non-transitory medium with software to execute on the computing system as recited in claim 16, further comprising code for:
generating a testbench;
verifying proper operation of the first model using the testbench.

* * * * *